US009431593B2

(12) United States Patent
Kato et al.

(10) Patent No.: US 9,431,593 B2
(45) Date of Patent: Aug. 30, 2016

(54) THERMOELECTRIC CONVERSION MATERIAL AND PRODUCTION METHOD THEREFOR

(71) Applicant: LINTEC CORPORATION, Itabashi-ku (JP)

(72) Inventors: Kunihisa Kato, Warabi (JP); Tsuyoshi Mutou, Saitama (JP); Takeshi Kondo, Saitama (JP)

(73) Assignee: LINTEC CORPORATION, Itabashi-ku (JP)

( * ) Notice: Subject to any disclaimer, the term of this patent is extended or adjusted under 35 U.S.C. 154(b) by 0 days.

(21) Appl. No.: 14/428,141

(22) PCT Filed: Jul. 25, 2014

(86) PCT No.: PCT/JP2014/069700
§ 371 (c)(1),
(2) Date: Mar. 13, 2015

(87) PCT Pub. No.: WO2015/019871
PCT Pub. Date: Feb. 12, 2015

(65) Prior Publication Data
US 2015/0228879 A1    Aug. 13, 2015

(30) Foreign Application Priority Data
Aug. 9, 2013  (JP) .................. 2013-166632

(51) Int. Cl.
*H01L 35/16* (2006.01)
*H01L 35/34* (2006.01)
*H01L 35/26* (2006.01)

(52) U.S. Cl.
CPC .............. *H01L 35/16* (2013.01); *H01L 35/26* (2013.01); *H01L 35/34* (2013.01)

(58) Field of Classification Search
CPC ....... H01L 35/34; H01L 35/12; H01L 35/14; H01L 35/32
USPC .............................................. 136/225, 236.1
See application file for complete search history.

(56) References Cited

U.S. PATENT DOCUMENTS

| 2003/0032709 A1* | 2/2003 | Toshima ................... C08K 3/08 524/439 |
| 2008/0036101 A1* | 2/2008 | Xiao ....................... B82Y 30/00 257/681 |
| 2011/0233458 A1* | 9/2011 | Texter ................. C08F 293/005 252/75 |
| 2013/0052458 A1* | 2/2013 | Nagamoto ............ C23C 14/086 428/336 |
| 2013/0333738 A1 | 12/2013 | Suemori et al. |
| 2015/0004733 A1* | 1/2015 | Wang ..................... C01B 19/007 438/54 |
| 2015/0048283 A1 | 2/2015 | Kato et al. |
| 2015/0075578 A1 | 3/2015 | Kato et al. |

FOREIGN PATENT DOCUMENTS

| JP | 2003-046145 A | 2/2003 |
| JP | 2010-123885 A | 6/2010 |
| JP | 2010-199276 A | 9/2010 |
| JP | 2012-009462 A | 1/2012 |
| WO | WO 2012/121133 A1 | 9/2012 |

OTHER PUBLICATIONS

Madan et al., "Dispernse printed composite thermoelectric thick films for thermoelectric generator applications", 2011, Journal of Applied Physics, 109, 034904-1 thru 034904-6.*
International Search Report and Written Opinion issued Oct. 21, 2014 in PCT/JP2014/069700 Filed Jul. 25, 2014.
Deepa Madan, et al., "Dispenser printed composite thermoelectric thick films for thermoelectric generator applications", Journal of Applied Physics, vol. 109, 2011, pp. 034904-1 to 034904-6.

* cited by examiner

*Primary Examiner* — Devina Pillay
*Assistant Examiner* — Daniel Malley, Jr.
(74) *Attorney, Agent, or Firm* — Oblon, McClelland, Maier & Neustadt, L.L.P

(57) ABSTRACT

The present invention provides a thermoelectric conversion material capable of being produced in a simplified manner and at a low cost and excellent in thermoelectric conversion characteristics and flexibility, and provides a method for producing the material. The thermoelectric conversion material has, on a support, a thin film of a thermoelectric semiconductor composition containing thermoelectric semiconductor fine particles, a heat-resistant resin and an ionic liquid. The method for producing a thermoelectric conversion material having, on a support, a thin film of a thermoelectric semiconductor composition containing thermoelectric semiconductor fine particles, a heat-resistant resin and an ionic liquid comprises a step of applying a thermoelectric semiconductor composition containing thermoelectric semiconductor fine particles, a heat-resistant resin and an ionic liquid onto a support and drying it to form a thin film thereon, and a step of annealing the thin film.

18 Claims, No Drawings

THERMOELECTRIC CONVERSION MATERIAL AND PRODUCTION METHOD THEREFOR

TECHNICAL FIELD

The present invention relates to a thermoelectric conversion material that carries out energy interconversion between heat and electricity, and especially relates to a thermoelectric conversion material that uses a thermoelectric semiconductor composition containing a particulated thermoelectric semiconductor, a heat-resistant resin and an ionic liquid and has improved thermoelectric conversion characteristics and flexibility, and to its production method.

BACKGROUND ART

Recently, a thermoelectric power-generating technology for which the system is simple and can be down-sized has been specifically noted as a power recovery technology for unharnessed exhaust heat that is generated from fossil fuel resources and others used in buildings, factories, etc. However, thermoelectric power generation is, in general, poorly efficient in power generation, and therefore, studies and developments are being actively made for improving power generation efficiency in various companies and research institutes. For improving power generation efficiency, it is indispensable to enhance the efficiency of thermoelectric conversion materials, and for realizing it, it is desired to develop materials having a high electrical conductivity comparable to that of metals and having a low thermal conductivity comparable to that of glass.

A thermoelectric performance can be evaluated by a figure of merit Z ($Z=\sigma S^2/\lambda$). Here, S means a Seebeck coefficient, σ means an electrical conductivity (reciprocal of resistivity), and λ means a thermal conductivity. Increasing the value of the figure of merit Z improves the power generation efficiency, and for enhancing the efficiency in power generation, it is important to find out a thermoelectric conversion material having a large Seebeck coefficient and a large electrical conductivity a, and having a small thermal conductivity λ.

As described above, investigations for improving power generation efficiency are needed while, on the other hand, thermoelectric conversion devices that are now produced are poor in mass-productivity and the power generation units therein are expensive. Consequently, for further disseminating the devices in use in large areas, for example, in installation thereof on the wall surface of buildings, production cost reduction is imperative. In addition, thermoelectric conversion devices that are produced at present are poorly flexible, and therefore flexible thermoelectric conversion devices are desired.

Given the situation, Patent Literature 1 discloses, for the purpose of improving power generation efficiency and for efficient production, a method for producing a thermoelectric conversion device that comprises a step of applying a solution to be a material of a p-type or n-type organic semiconductor device, onto a support having an insulator, by coating or printing thereon followed by drying it. On the other hand, in Non-Patent Literature 1, an investigation is made, using a composition prepared by dispersing, as a thermoelectric conversion material, bismuth telluride in an epoxy resin, and forming the composition into a film by coating, thereby producing a thin-film thermoelectric conversion device. Further, a thermoelectric material that comprises an organic thermoelectric material such as a polythiophene or a derivative thereof and an inorganic thermoelectric material which are integrated in a dispersed state (Patent Literature 2), and an organic-inorganic hybrid thermoelectric material that comprises, as an inorganic thermoelectric material, inorganic particles having an average particle diameter of 1 to 100 nm and being substantially free from a protective agent that may be a factor obstructing carrier transfer, and an organic thermoelectric material (Patent Literature 3) are being investigated.

CITATION LIST

Patent Literature

Patent Literature 1: JP-A 2010-199276
Patent Literature 2: JP-A 2003-46145
Patent Literature 3: JP-A 2012-9462

Non-Patent Literature

Non-Patent Literature 1: D. Madan, Journal of Applied Physics 2011, 109, 034904.

SUMMARY OF INVENTION

Technical Problem

However, in Patent Literature 1, the method requires patterning that includes alignments to be repeated plural times by screen printing or the like, for example, implanting a conductive layer, and a p-type and n-type organic semiconductor devices between the patterned insulating layers on the support, and therefore the step is complicated and, as a result, the takt time is long, therefore providing a problem of rising costs, and moreover, the thermoelectric performance is not sufficient.

In addition, the thin-film thermoelectric conversion device in Non-Patent Literature 1 requires heat treatment at a high temperature not lower than the decomposition temperature of the binder resin, and therefore the flexibility of the device could be on the same level as that in the case of forming a film of bismuth telluride alone, and moreover, the thermoelectric performance is not sufficient.

Further, the thermoelectric materials in Patent Literature 2 and 3 are risky in that, when these are heat-treated at a high temperature not lower than the decomposition temperature of the organic thermoelectric material therein after thin films of the thermoelectric material have been formed for the purpose of further improving the thermoelectric performance thereof, then the organic thermoelectric material may be burned down and the thermoelectric performance of those material would be thereby lowered.

In consideration of the above-mentioned situation, an object of the present invention is to provide a thermoelectric conversion material excellent in thermoelectric performance and flexibility, and can be produced in a simplified manner and at a low cost, and to provide a method for producing the material.

Solution to Problem

The present inventors have assiduously made repeated studies for solving the above-mentioned problems and, as a result, have found that, when a thin film of a thermoelectric semiconductor composition that contains a particulated thermoelectric semiconductor capable of contributing toward thermal conductivity reduction, a heat-resistant resin and an ionic liquid capable of preventing electrical conductivity reduction in the spaces between the fine particles, is formed on a support, then a thermoelectric conversion material having a higher figure of merit and having excellent flexibility as compared with the above-mentioned existing thermoelectric conversion materials can be obtained, and have completed the present invention.

Specifically, the present invention provides the following (1) to (13):

(1) A thermoelectric conversion material having, on a support, a thin film of a thermoelectric semiconductor composition containing thermoelectric semiconductor fine particles, a heat-resistant resin and an ionic liquid.

(2) The thermoelectric conversion material according to the above (1), wherein the blending amount of the ionic liquid is from 0.01 to 50% by mass in the thermoelectric semiconductor composition.

(3) The thermoelectric conversion material according to the above (1), wherein the cation component of the ionic liquid contains at least one selected from a pyridinium cation and its derivatives, and an imidazolium cation and its derivatives.

(4) The thermoelectric conversion material according to the above (1), wherein the anion component of the ionic liquid contains a halide anion.

(5) The thermoelectric conversion material according to the above (4), wherein the halide anion contains at least one selected from $Cl^-$, $Br^-$ and $I^-$.

(6) The thermoelectric conversion material according to the above (1), wherein the heat-resistant resin is at least one selected from polyamide resins, polyamideimide resins, polyimide resins and epoxy resins.

(7) The thermoelectric conversion material according to the above (1), wherein the blending amount of the thermoelectric semiconductor fine particles is from 30 to 99% by mass in the thermoelectric semiconductor composition.

(8) The thermoelectric conversion material according to the above (1), wherein the mean particle size of the thermoelectric semiconductor fine particles is from 10 nm to 200 µm.

(9) The thermoelectric conversion material according to the above (1), wherein the thermoelectric semiconductor fine particles are fine particles of a bismuth-tellurium-based thermoelectric semiconductor material.

(10) The thermoelectric conversion material according to the above (1), wherein the support is a plastic film.

(11) The thermoelectric conversion material according to the above (10), wherein the plastic film is at least one selected from polyimide films, polyamide films, polyether imide films, polyaramid films and polyamideimide films.

(12) A method for producing a thermoelectric conversion material having, on a support, a thin film of a thermoelectric semiconductor composition containing thermoelectric semiconductor fine particles, a heat-resistant resin and an ionic liquid, which comprises a step of applying the thermoelectric semiconductor composition containing thermoelectric semiconductor fine particles, a heat-resistant resin and an ionic liquid onto the support, followed by drying it, to form a thin film thereon, and a step of annealing the thin film.

(13) The method for producing a thermoelectric conversion material according to the above (12), wherein the support is a plastic film.

Advantageous Effects of Invention

According to the present invention, there is provided a thermoelectric conversion material capable of being produced in a simplified manner and at a low cost and excellent in thermoelectric performance and flexibility.

DESCRIPTION OF EMBODIMENTS

Thermoelectric Conversion Material

The thermoelectric conversion material of the present invention has, on a support, a thin film of a thermoelectric semiconductor composition containing thermoelectric semiconductor fine particles, a heat-resistant resin and an ionic liquid.

(Support)

Not specifically defined, the support for use in the thermoelectric conversion material of the present invention may be any one not having any influence on lowering the electrical conductivity of the thermoelectric conversion material and on increasing the thermal conductivity thereof. The support includes, for example, glass, silicon, plastic films, etc. Above all, preferred are plastic films from the viewpoint that they are excellent in flexibility.

Concretely, the plastic films include polyethylene terephthalate films, polyethylene naphthalate films, polyimide films, polyamide films, polyether imide films, polyaramid films, polyamideimide films, polyether ketone films, polyether ether ketone films, polyphenylene sulfide films, poly(4-methylpentene-1) films, etc. Laminates of these films are also employable here.

Of those, from the viewpoint that, even when the thin film of a thermoelectric semiconductor composition is annealed, the support is not thermally deformed and can keep the performance of the thermoelectric conversion material, and the support has high heat resistance and dimensional stability, preferred are polyimide films, polyamide films, polyether imide films, polyaramid films and polyamideimide films, and especially preferred are polyimide films from the viewpoint of general versatility thereof.

The thickness of the support is, from the viewpoint of the flexibility, the heat resistance and the dimensional stability thereof, preferably from 1 to 1000 µm, more preferably from 10 to 500 µm, even more preferably from 20 to 100 µm.

Also preferably, the decomposition temperature of the plastic film is 300° C. or higher.

(Thermoelectric Semiconductor Fine Particles)

The thermoelectric semiconductor fine particles for use in the thermoelectric conversion material of the present invention may be prepared by grinding a thermoelectric semiconductor material into a predetermined size, using a fine grinding mill or the like.

The thermoelectric semiconductor material is not specifically limited, as long as it is a material capable of generating a thermoelectromotive force when given a temperature difference applied thereto, and includes, for example, a bismuth-tellurium-based thermoelectric semiconductor material such as a p-type bismuth telluride, an n-type bismuth telluride, $Bi_2Te_3$, etc.; a telluride-based thermoelectric semiconductor material such as GeTe, PbTe, etc.; an antimony-telluride-based thermoelectric semiconductor material; a zinc-antimony-based thermoelectric semiconductor material such as ZnSb, $Zn_3Sb_2$, $Zn_4Sb_3$, etc.; a silicon-germanium-based thermoelectric semiconductor material such as SiGe, etc.; a bismuth-selenide-based thermoelectric semiconductor material such as $Bi_2Se_3$, etc., a silicide-based thermoelectric semiconductor material such as β-$FeSi_2$, $CrSi_2$, $MnSi_{1.73}$, $Mg_2Si$, etc.; an oxide-based thermoelectric semiconductor material; a Heusler material such as FeVAl, FeVAlSi, FeVTiAl, etc.; and a sulfide-based thermoelectric semiconductor material such as TiS$_2$, etc.

Of those, for the thermoelectric semiconductor material for use in the present invention, preferred is a bismuth-tellurium-based thermoelectric semiconductor material such as a p-type bismuth telluride, an n-type bismuth telluride, Bi$_2$Te$_3$, etc.

The carrier of the p-type bismuth telluride is a hole and the Seebeck coefficient thereof is positive, for which, for example, preferably used is one represented by Bi$_x$Te$_3$Sb$_{2-x}$. In this case X preferably satisfies 0<X≤0.8, more preferably 0.4≤X≤0.6. X of more than 0 and 0.6 or less is preferred since the Seebeck coefficient and the electrical conductivity of the material are large and the material can maintain the characteristics of p-type thermoelectric conversion material.

The carrier of the n-type bismuth telluride is an electron and the Seebeck coefficient thereof is negative, for which, for example, preferably used is one represented by Bi$_2$Te$_{3-Y}$Se$_Y$. In this case Y is preferably satisfies 0≤Y≤3, more preferably 0.1<Y≤2.7. Y of from 0 to 3 is preferred since the Seebeck coefficient and the electrical conductivity of the material are large and the material can maintain the characteristics of n-type thermoelectric conversion material.

The blending amount of the thermoelectric semiconductor fine particles in the thermoelectric semiconductor composition for use in the present invention is preferably from 30 to 99% by mass. The amount is more preferably from 50 to 96% by mass, even more preferably from 70 to 95% by mass. The blending amount of the thermoelectric semiconductor fine particles falling within the above range is preferred since the absolute value of the Seebeck coefficient is large, the electrical conductivity reduction can be prevented, only the thermal conductivity is lowered, and therefore the material exhibits high-level thermoelectric performance and can form a film having a sufficient film strength and flexibility.

The mean particle size of the thermoelectric semiconductor fine particles for use in the present invention is preferably from 10 nm to 200 µm, more preferably from 10 nm to 30 µm, even more preferably from 50 nm to 10 µm, and especially preferably from 1 to 6 µm. Falling within the range, uniform dispersion is easy and electrical conductivity can be increased.

The method of producing the thermoelectric semiconductor fine particles by finely grinding the thermoelectric semiconductor material is not specifically defined, and the material may be ground into a predetermined size, using a known fine grinding mill or the like, such as a jet mill, a ball mill, a bead mill, a colloid mill, a conical mill, a disc mill, an edge mill, a powdering mill, a hammer mill, a pellet mill, a whirly mill, a roller mill, etc.

The mean particle size of the thermoelectric semiconductor fine particles may be measured with a laser diffraction particle sizer (1064 Model, manufactured by CILAS), and the median value of the particle size distribution is taken as the mean particle size.

Preferably, the thermoelectric semiconductor fine particles for use in the present invention are annealed. (Hereinafter the annealing may be referred to as annealing treatment A.) The annealing treatment A increases the crystallinity of the thermoelectric semiconductor fine particles and further increases the Seebeck coefficient of the thermoelectric conversion material since the surface oxide film of the thermoelectric semiconductor fine particles could be removed, therefore further increasing the figure of merit thereof. Not specifically defined, the annealing treatment A is preferably carried out in an inert gas atmosphere such as nitrogen, argon or the like in which the gas flow rate is controlled or in a reducing gas atmosphere such as hydrogen or the like in which also the gas flow rate is controlled, or in a vacuum condition, at a temperature not higher than the melting point of the fine particles, for a few minutes to a few dozen hours, before preparation of the thermoelectric semiconductor composition so that the treatment could not have any negative influence on the thermoelectric semiconductor fine particles therein. Concretely, though depending on the thermoelectric semiconductor fine particles to be used, it is desirable that the treatment is carried out generally at 100 to 1500° C. for a few minutes to a few dozen hours.

(Ionic Liquid)

The ionic liquid for use in the present invention is a molten salt comprising a combination of a cation and an anion, and is a salt capable of existing as a liquid in a broad temperature region of from −50 to 500° C. The ionic liquid has various characteristics in that it has an extremely low vapor pressure and is nonvolatile, that it has excellent heat stability and electrochemical stability, and that its viscosity is low and that its ionic conductivity is high, and consequently, the ionic liquid can effectively prevent reduction in the electrical conductivity between thermoelectric semiconductor fine particles, serving as a conductive assistant. In addition, the ionic liquid exhibits high polarity based on the aprotic ionic structure thereof and is excellent in compatibility with a heat-resistant resin, and consequently, the ionic liquid can make the thermoelectric conversion material have a uniform electrical conductivity.

As the ionic liquid, any known one or commercially-available one is employable here. For example, herein mentioned are those composed of a cation component such as a nitrogen-containing cyclic cation compound, e.g., pyridinium, pyrimidinium, pyrazolium, pyrrolidinium, piperidinium, imidazolium or the like and a derivative thereof, a tetraalkylammonium type amine-based cation and a derivative thereof, a phosphine-based cation, e.g., phosphonium, trialkylsulfonium, tetraalkylphosphonium or the like and a derivative thereof, a lithium cation and a derivative thereof, etc., and an anion component such as a chloride ion of Cl$^-$, AlCl$_4^-$, Al$_2$Cl$_7^-$, ClO$_4^-$ or the like, a bromide ion of Br or the like, an iodide ion of I$^-$ or the like, a fluoride ion of BF$_4^-$, PF$_6^-$ or the like, a halide anion of F(HF)$_n^-$ or the like, NO$_3^-$, CH$_3$COO$^-$, CF$_3$COO$^-$, CH$_3$SO$_3^-$, CF$_3$SO$_3^-$, (FSO$_2$)$_2$N$^-$, (CF$_3$SO$_2$)$_2$N$^-$, (CF$_3$SO$_2$)$_3$C$^-$, AsF$_6^-$, SbF$_6^-$, NbF$_6^-$, TaF$_6^-$, F(HF)$_n^-$, (CN)$_2$N$^-$, C$_4$F$_9$SO$_3^-$, (C$_2$F$_5$SO$_2$)$_2$N$^-$, C$_3$F$_7$COO$^-$, (CF$_3$SO$_2$)(CF$_3$CO)N$^-$ or the like.

Of the ionic liquids mentioned above, the cation component preferably contains at least one selected from a pyridinium cation and its derivatives, and an imidazolium cation and its derivatives, from the viewpoint of securing high-temperature stability and compatibility between thermoelectric semiconductor fine particles and resin, and from the viewpoint of preventing reduction in the electrical conductivity between thermoelectric semiconductor fine particles. Also preferably, the anion component of the ionic liquid contains a halide anion, more preferably at least one selected from Cl$^-$, Br$^-$ and I$^-$.

Specific examples of the ionic liquid in which the cationic component contains any of a pyridinium cation and a derivative thereof include 4-methyl-butylpyridinium chloride, 3-methyl-butylpyridinium chloride, 4-methyl-hexylpyridinium chloride, 3-methyl-hexylpyridinium chloride, 4-methyl-octylpyridinium chloride, 3-methyl-octylpyridinium chloride, 3,4-dimethyl-butylpyridinium chloride, 3,5-dimethyl-butylpyridinium chloride, 4-methyl-butylpyridinium tetrafluoroborate, 4-methyl-butylpyridinium hexafluorophosphate, 1-butyl-4-methylpyridinium bromide, 1-butyl-4-methylpyridinium hexafluorophosphate, 1-butyl-4-methylpyridinium iodide, etc. Of those, preferred are 1-butyl-4-methylpyridinium bromide, 1-butyl-4-methylpyridinium hexafluorophosphate and 1-butyl-4-methylpyridinium iodide.

Specific examples of the ionic liquid in which the cationic component contains any of an imidazolium cation and a derivative thereof include [1-butyl-3-(2-hydroxyethyl)imidazolium bromide], [1-butyl-3-(2-hydroxyethyl)imidazolium tetrafluoroborate], 1-ethyl-3-methylimidazolium chloride, 1-ethyl-3-methylimidazolium bromide, 1-butyl-3-methylimidazolium chloride, 1-hexyl-3-methylimidazolium chloride, 1-octyl-3-methylimidazolium chloride, 1-decyl-3-methylimidazolium chloride, 1-decyl-3-methylimidazolium bromide, 1-dodecyl-3-methylimidazolium chloride, 1-tetradecyl-3-methylimidazolium chloride, 1-ethyl-3-methylimidazolium tetrafluoroborate, 1-butyl-3-methylimidazolium tetrafluoroborate, 1-hexyl-3-methylimidazolium tetrafluoroborate, 1-ethyl-3-methylimidazolium hexafluorophosphate, 1-butyl-3-methylimidazolium hexafluorophosphate, 1-methyl-3-butylimidazolium methylsulfate, 1,3-dibutylimidazolium methylsulfate, etc. Of those, preferred are [1-butyl-3-(2-hydroxyethyl)imidazolium bromide], and [1-butyl-3-(2-hydroxyethyl)imidazolium tetrafluoroborate].

Preferably, the above ionic liquid has an electrical conductivity of $10^{-7}$ S/cm or more, more preferably $10^{-6}$ S/cm or more. When the ionic conductivity falls within the above range, then the ionic liquid serving as a conductive assistant can effectively prevent reduction in the electrical conductivity between the thermoelectric semiconductor fine particles.

Also preferably, the decomposition temperature of the ionic liquid is 300° C. or higher. When the decomposition temperature falls within the above range, then the ionic liquid can still maintain the effect thereof as a conductive assistant even when the thin film of the thermoelectric semiconductor composition is annealed, as described below.

Preferably, the mass reduction in the ionic liquid at 300° C. in thermogravimetry (TG) is 10% or less, more preferably 5% or less, even more preferably 1% or less. When the mass reduction falls within the above range, then the ionic liquid can still maintain the effect thereof as a conductive assistant even when the thin film of the thermoelectric semiconductor composition is annealed, as described below.

The blending amount of the ionic liquid in the thermoelectric semiconductor composition is preferably from 0.01 to 50% by mass, more preferably from 0.5 to 30% by mass, even more preferably from 1.0 to 20% by mass. When the blending amount of the ionic liquid falls within the above range, then the electrical conductivity can be effectively prevented from lowering and a film having a high thermoelectric performance level can be realized.

(Heat-Resistant Resin)

The heat-resistant resin for use in the present invention acts as a binder between the thermoelectric semiconductor fine particles and enhances the flexibility of the thermoelectric conversion material. The heat-resistant resin is not specifically defined. The heat-resistant resin for use herein is one that can maintain various physical properties thereof such as mechanical strength and thermal conductivity thereof as a resin without losing them in crystal growth of the thermoelectric semiconductor fine particles through annealing treatment of the thin film of the thermoelectric semiconductor composition.

The heat-resistant resin includes, for example, polyamide resins, polyamideimide resins, polyimide resins, polyether imide resins, polybenzoxazole resins, polybenzimidazole resins, epoxy resins, and copolymers having a chemical structure of these resins. One alone or two or more of the above-mentioned heat-resistant resins may be used here either singly or as combined. Of those, preferred are polyamide resins, polyamideimide resins, polyimide resins and epoxy resins, from the viewpoint that their heat resistance is higher and that they do not have any negative influence on the crystal growth of the thermoelectric semiconductor fine particles in the thin film. More preferred are polyamide resins, polyamideimide resins and polyimide resins from the viewpoint that they are excellent in flexibility. In case where a polyimide film is used as the support, polyimide resins are more preferred as the heat-resistant resin, from the viewpoint of the adhesiveness thereof to the polyimide film. In the present invention, polyimide resin is a generic term for polyimide and its precursor.

Preferably, the decomposition temperature of the heat-resistant resin is 300° C. or higher. When the decomposition temperature falls within the above range, then the resin does not lose the function thereof as a binder and can maintain the flexibility of the thermoelectric conversion material even when the thin film of the thermoelectric semiconductor composition is annealed, as described below.

Preferably, the mass reduction in the heat-resistant resin at 300° C. in thermogravimetry (TG) is 10% or less, more preferably 5% or less, even more preferably 1% or less. When the mass reduction falls within the above range, then the resin does not lose the function thereof as a binder and can maintain the flexibility of the thermoelectric conversion material even when the thin film of the thermoelectric semiconductor composition is annealed, as described below.

The blending amount of the heat-resistant resin in the thermoelectric semiconductor composition is preferably from 0 to 40% by mass, more preferably from 0.5 to 20% by mass, even more preferably from 1 to 20% by mass. The blending amount of the heat-resistant resin falling within the above range provides a film satisfying both good thermoelectric performance and film strength.

If desired, the thermoelectric semiconductor composition for use in the present invention may further contain, in addition to the above-mentioned thermal semiconductor fine particles, the above-mentioned heat-resistant resin and the above-mentioned ionic liquid, any other additives such as dispersant, film formation assistant, light stabilizer, antioxidant, tackifier, plasticizer, colorant, resin stabilizer, filler, pigment, conductive filler, conductive polymer, curing agent, etc. One alone or two or more of these additives may be used here either singly or as combined.

The method for preparing the thermoelectric semiconductor composition for use in the present invention is not specifically defined. The thermoelectric semiconductor composition may be prepared by mixing and dispersing the above-mentioned thermoelectric semiconductor fine particles, the above-mentioned ionic liquid and the above-mentioned heat-resistant resin, optionally along with any other additives and also with a solvent added thereto, according to a known method using an ultrasonic homogenizer, a spiral mixer, a planetary mixer, a disperser, a hybrid mixer or the like.

The solvent includes, for example, toluene, ethyl acetate, methyl ethyl ketone, alcohols, tetrahydrofuran, methylpyrrolidone, ethylcellosolve, etc. One alone or two or more different types of these solvents may be used here either singly or as combined. The solid concentration of the thermoelectric semiconductor composition is not specifically defined so far as the composition may have a viscosity suitable for coating operation.

A thin film of the thermoelectric semiconductor composition may be formed by applying the thermoelectric semiconductor composition onto a support and drying it thereon, as described for the production method for the thermoelectric conversion material of the present invention to be given hereinunder. According to the formation method, a large-area thermoelectric conversion material can be produced in a simplified manner at a low cost.

The thickness of the thin film of the thermoelectric semiconductor composition is not specifically defined, but is, from the viewpoint of the thermoelectric performance and the film strength, preferably from 100 nm to 200 µm, more preferably from 300 nm to 150 µm, even more preferably from 5 to 150 µm.

The thermoelectric conversion material of the present invention may be used singly, but for example, plural pieces of the thermoelectric conversion material may be used by being electrically connected in series to each other via an electrode and thermally connected in parallel to each other via a ceramic material or an insulating flexible sheet or the like, and can be used as a thermoelectric conversion device for power generation or for cooling.

[Method for Producing Thermoelectric Conversion Material]

A method for producing the thermoelectric conversion material of the present invention comprises a step of applying the above-mentioned thermoelectric semiconductor composition onto a support and drying it to form a thin film thereon (hereinafter this may be referred to as a thin film-forming step), and a step of annealing the thin film (hereinafter this may be referred to as an annealing step). The steps that the present invention includes are described in series hereinunder.

(Thin Film-Forming Step)

The method of applying the thermoelectric semiconductor composition of the present invention onto a support is not specifically defined, for which employable is any known method of screen printing, flexographic printing, gravure printing, spin coating, dip coating, die coating, spray coating, bar coating, doctor blade coating or the like. In the case where the coating film is pattern-like formed, preferably employed is screen printing, slot die coating or the like that realizes patterning in a simplified manner using a screen having a desired pattern.

Next, the resultant coating film is dried to give a thin film. As the drying method, employable is any known drying method of hot air drying, hot roll drying, IR radiation, etc. The heating temperature is generally from 80 to 150° C., and the heating time is generally from a few seconds to several tens minutes though it varies depending on the heating method.

In the case where a solvent is used in preparing the thermoelectric semiconductor composition, the heating temperature is not specifically defined so far as it falls within a temperature range capable of removing the used solvent through vaporization.

(Annealing Step)

The resultant thermoelectric conversion material is, after thin film formation, preferably further annealed (hereinafter this treatment may be referred to as annealing treatment B). The annealing treatment B stabilizes the thermoelectric performance of the material and promotes the crystal growth of the thermoelectric semiconductor fine particles in the thin film, therefore further enhancing the thermoelectric performance of the material. Not specifically defined, the annealing treatment B is preferably carried out in an inert gas atmosphere such as nitrogen, argon or the like or in a reducing gas atmosphere, in which the gas flow rate is controlled, or in a vacuum condition. Depending on the upper temperature limit of the resin and the ionic fluid to be used, the treatment may be carried out at 100 to 500° C. for a few minutes to several tens hours.

According to the production method of the present invention, there is provided a low-cost thermoelectric conversion material having a high thermoelectric performance, in a simplified manner.

EXAMPLES

Next, the present invention is described in more detail by reference to the Examples, but it should be construed that the present invention is not limited to these Examples at all.

The thermoelectric performance and the flexibility of the thermoelectric conversion materials produced in Examples and Comparative Examples were evaluated according to the methods mentioned below, in which the electrical conductivity, the Seebeck coefficient and the thermal conductivity of each material were calculated.

<Thermoelectric Performance Evaluation>

(a) Electrical Conductivity

Using a surface resistivity meter (Mitsubishi Chemical's trade name:Loresta GP MCP-T600) and according to a four-terminal method, the surface resistivity of each sample of the thermoelectric conversion materials produced in Examples and Comparative Examples was measured, and the electrical conductivity ($\sigma$) thereof was calculated.

(b) Seebeck Coefficient

According to JIS C 2527:1994, the thermoelectromotive force of the thermoelectric conversion material produced in Examples and Comparative Examples was measured, and the Seebeck coefficient (S) was calculated. One end of the thermal conversion material produced was heated, and the resulting temperature difference between both ends of the thermal conversion material was measured using a chromel-alumel thermocouple, and from the electrode adjacent to the thermocouple installation position, the thermoelectromotive force was measured.

Concretely, the distance between both ends of the sample of which the temperature difference and the electromotive force were to be measured was to be 25 mm, one end was kept at 20° C., and the other end was heated from 25° C. to 50° C. at intervals of 1° C. whereupon the thermoelectromotive force was measured and the Seebeck coefficient (S) was calculated from the inclination. The installation positions of the thermocouples and the electrodes are symmetric to each other relative to the centerline of the thin film, and the distance between the thermocouple and the electrode is 1 mm.

(c) Thermal Conductivity

In the thermal conductivity measurement, the thermal conductivity ($\lambda$) was calculated according to 3$\omega$ method.

From the found data of the electrical conductivity, the Seebeck coefficient and the thermal conductivity, the figure of merit Z ($Z=\sigma S^2/\lambda$) was obtained, and the non-dimensional figure of merit ZT (T=300K) was calculated.

<Flexibility Evaluation>

The thermoelectric conversion materials produced in Examples and Comparative Examples were tested for flexibility of the thin film around a mandrel diameter $\phi$ 10 mm, according to a cylindrical mandrel method. Before and after the cylindrical mandrel test, the thermoelectric conversion materials were tested for the outward appearance and the thermoelectric performance thereof, and the flexibility thereof was thereby evaluated according to the following criteria.

Case where there was no abnormality in the appearance of the thermoelectric conversion material before and after the test and the non-dimensional figure of merit ZT of the material did not change: A Case where there was no abnormality in the appearance of the thermoelectric conversion material before and after the test and the reduction in the ZT thereof was less than 30%: B Case where the thermoelectric conversion material after the test had the occurrence of cracks and the like or the reduction in the ZT thereof was 30% or more: C (Production Method for Thermoelectric Semiconductor Fine Particles)

Using an ultra-fine grinder (NanoJetmizer NJ-50-B Model, manufactured by Aishin Nanotechnologies Co., Ltd.), a p-type bismuth telluride $Bi_{0.4}Te_3Sb_{1.6}$ (manufactured by Kojundo Chemical Laboratory Co., Ltd., particle size: 180 μm) of a bismuth-tellurium-based thermoelectric semiconductor material was ground in a nitrogen gas atmosphere to give three types of thermoelectric semiconductor fine particles T1 to T3 each having a different mean particle size. The resultant ground thermoelectric semiconductor fine particles were analyzed for particle size distribution, using a laser diffraction particle size analyzer (1064 Model, manufactured by CILAS).

The mean particle sizes of the resultant fine particles T1 to T3 of the bismuth-tellurium-based thermoelectric semiconductor material were 0.66 μm (T1), 2.8 μm (T2) and 5.5 μm (T3), respectively.

In the same manner as above, $Bi_2Se_3$ (by Kojundo Chemical Laboratory, particle size: 80 μm) being a bismuth-selenide-based thermoelectric semiconductor material was ground to give thermoelectric semiconductor fine particles T4 of the bismuth-selenide-based thermoelectric semiconductor material having a mean particle size of 0.88 μm.

Also in the same manner as above, $TiS_2$ (manufactured by Kojundo Chemical Laboratory Co., Ltd.) being a sulfide-based thermoelectric semiconductor material was ground to give thermoelectric semiconductor fine particles T5 of the sulfide-based thermoelectric semiconductor material having a mean particle size of 2.0 μm.

Example 1

(1) Production of Thermoelectric Semiconductor Composition

The resultant fine particles T1 of the bismuth-telluride-based thermoelectric semiconductor material, a polyamic acid being a polyimide precursor as a heat-resistant resin (poly(pyromellitic dianhydride-co-4,4'-oxydianiline) solution manufactured by Sigma-Aldrich Corporation, solvent: methylpyrrolidone, solid concentration: 5% by mass, decomposition temperature: 490° C., mass reduction at 300° C. in thermogravimetry: 0.5%), and as an ionic liquid, [1-butyl-3-(2-hydroxyethyl)imidazolium bromide] (in Table 1, ionic liquid 1, electrical conductivity: $7.2\times10^{-4}$ S/cm) were mixed and dispersed so that the blending ratio thereof could be as in Example 1 in Table 1, thereby preparing a coating liquid of a thermoelectric semiconductor composition.

(2) Production of Thermoelectric Conversion Material (1) The coating liquid prepared in (1) was applied onto a polyimide film of a support (trade name "Kapton" manufactured by DuPont-Toray Co., Ltd., thickness 50 μm), according to a spin coating method, and then dried in an argon atmosphere at a temperature of 150° C. for 10 minutes to give a thin film having a thickness of 10 μm. Next, the resultant thin film was heated in a mixed gas atmosphere of hydrogen and argon (hydrogen/argon=5% by volume/95% by volume) at a heating rate of 5 K/min, kept at 350° C. for 1 hour to thereby perform the annealing treatment B after the thin film formation, thereby inducing crystal growth of the fine particles of the thermoelectric semiconductor material to give a thermoelectric conversion material.

Example 2

A thermoelectric conversion material was produced in the same manner as in Example 1 except that the thermoelectric semiconductor fine particles were changed from T1 to T2.

Example 3

A thermoelectric conversion material was produced in the same manner as in Example 1 except that the thermoelectric semiconductor fine particles were changed from T1 to T3.

Example 4

A thermoelectric conversion material was produced in the same manner as in Example 2 except that the ionic liquid was changed from [1-butyl-3-(2-hydroxyethyl)imidazolium bromide] to [1-butyl-3-(2-hydroxyethyl)imidazolium tetrafluoroborate] (in Table 1, the ionic liquid 2, electrical conductivity: $1.8\times10^{-4}$ S/cm).

Example 5

A thermoelectric conversion material was produced in the same manner as in Example 1 except that fine particles T1 being the bismuth-telluride-based thermoelectric semiconductor material were changed to fine particles T4 being the bismuth-selenide-based thermoelectric semiconductor material.

Example 6

A thermoelectric conversion material was produced in the same manner as in Example 1 except that the heat-resistant resin was changed to an epoxy resin (EPON 862, manufactured by Hexion Specialty Chemicals Inc., decomposition temperature: 300° C.), and a curing agent (Dixie Chemicals' methylhexahydrophthalic anhydride) was added in an amount of 4.25% by mass relative to the epoxy resin.

Example 7

A thermoelectric conversion material was produced in the same manner as in Example 2 except that the ionic liquid was changed from [1-butyl-3-(2-hydroxyethyl)imidazolium bromide] to 1-butyl-4-methylpyridinium bromide (manufactured by Tokyo Chemical Industry Co., Ltd., in Table 1, the ionic liquid 3, electrical conductivity: $3.5\times10^{-5}$ S/cm).

Example 8

A thermoelectric conversion material was produced in the same manner as in Example 2 except that the ionic liquid was changed from [1-butyl-3-(2-hydroxyethyl)imidazolium bromide] to 1-butyl-4-methylpyridinium hexafluorophosphate (manufactured by Tokyo Chemical Industry Co., Ltd., in Table 1, the ionic liquid 4, electrical conductivity: $1.4 \times 10^{-4}$ S/cm).

Example 9

A thermoelectric conversion material was produced in the same manner as in Example 7 except that the thickness of the film of the thermoelectric semiconductor composition was changed from 10 μm to 100 μm.

Example 10

A thermoelectric conversion material was produced in the same manner as in Example 2 except that the ionic liquid was changed to 1-butyl-4-methylpyridinium iodide (by Sigma Aldrich Japan K.K., in Table 1, the ionic liquid 5, electrical conductivity: $2.4 \times 10^{-4}$ S/cm).

Example 11

A thermoelectric conversion material was produced in the same manner as in Example 7 except that the thermoelectric semiconductor fine particles were changed from T1 to T5.

Examples 12 to 14

Thermoelectric conversion materials were produced in the same manner as in Example 1 except that the blending amount of the thermoelectric semiconductor fine particles T1 was changed from 90% by mass to 85, 80 or 55%, respectively by mass as shown in Table 1, and the blending amount of the ionic liquid 1 was changed from 5% by mass to 10, 15 or 40% by mass as shown in Table 1.

Comparative Example 1

A thermoelectric conversion material was produced in the same manner as in Example 2 except that the ionic liquid was not added and the blending amount of the polyimide resin was changed from 5% by mass to 10% by mass.

Comparative Example 2

A thermoelectric conversion material was produced in the same manner as in Example 2 except that a coating liquid of a thermoelectric semiconductor composition was prepared, in which, however, a heat-resistant resin was not added and a mixture of poly(3,4-ethylenedioxythiophene) and polystyrenesulfonate ion being a conductive polymer (in Table 1, PEDOT:PSS), the ionic liquid 1 and the thermoelectric semiconductor fine particles T2 were mixed and dispersed in the blending ratio as in Table 1.

Comparative Example 3

A thermoelectric conversion material was produced in the same manner as in Comparative Example 2, in which, however, the annealing treatment B was omitted.

Comparative Example 4

A thermoelectric conversion material was produced in the same manner as in Example 11 except that the ionic liquid was not added and the blending amount of the polyimide resin was changed from 5% by mass to 10% by mass.

TABLE 1

| | Thermoelectric Semiconductor Fine Particles | | Heat-Resistant Resin | | Ionic Liquid | | Conductive |
| --- | --- | --- | --- | --- | --- | --- | --- |
| | Blending Amount (% by mass) | Mean Particle Size (μm) | Type | Blending Amount (% by mass) | Type | Blending Amount (% by mass) | Polymer PEDOT:PSS (% by mass) |
| Example 1 | T1 90 | 0.66 | Polyimide Resin | 5 | Ionic Liquid 1 | 5 | — |
| Example 2 | T2 90 | 2.8 | Polyimide Resin | 5 | Ionic Liquid 1 | 5 | — |
| Example 3 | T3 90 | 5.5 | Polyimide Resin | 5 | Ionic Liquid 1 | 5 | — |
| Example 4 | T2 90 | 2.8 | Polyimide Resin | 5 | Ionic Liquid 2 | 5 | — |
| Example 5 | T4 90 | 0.88 | Polyimide Resin | 5 | Ionic Liquid 1 | 5 | — |
| Example 6 | T1 90 | 0.66 | Epoxy Resin | 5 | Ionic Liquid 1 | 5 | — |
| Example 7 | T2 90 | 2.8 | Polyimide Resin | 5 | Ionic Liquid 3 | 5 | — |
| Example 8 | T2 90 | 2.8 | Polyimide Resin | 5 | Ionic Liquid 4 | 5 | — |
| Example 9 | T2 90 | 2.8 | Polyimide Resin | 5 | Ionic Liquid 3 | 5 | — |
| Example 10 | T2 90 | 2.8 | Polyimide Resin | 5 | Ionic Liquid 5 | 5 | — |
| Example 11 | T5 90 | 2.8 | Polyimide Resin | 5 | Ionic Liquid 3 | 5 | — |
| Example 12 | T1 85 | 0.66 | Polyimide Resin | 5 | Ionic Liquid 1 | 10 | — |
| Example 13 | T1 80 | 0.66 | Polyimide Resin | 5 | Ionic Liquid 1 | 15 | — |
| Example 14 | T1 55 | 0.66 | Polyimide Resin | 5 | Ionic Liquid 1 | 40 | — |
| Comparative Example 1 | T2 90 | 2.8 | Polyimide Resin | 10 | — | — | — |

TABLE 1-continued

| | Thermoelectric Semiconductor Fine Particles | | Heat-Resistant Resin | | Ionic Liquid | | Conductive |
|---|---|---|---|---|---|---|---|
| | Blending Amount (% by mass) | Mean Particle Size (μm) | Type | Blending Amount (% by mass) | Type | Blending Amount (% by mass) | Polymer PEDOT:PSS (% by mass) |
| Comparative Example 2 | T2 90 | 2.8 | — | — | Ionic Liquid 1 | 5 | 5 |
| Comparative Example 3 | T2 90 | 2.8 | — | — | Ionic Liquid 1 | 5 | 5 |
| Comparative Example 4 | T5 90 | 2.8 | Polyimide Resin | 10 | — | — | — |

The evaluation results of the thermoelectric performance and the flexibility with respect to the thermoelectric conversion materials obtained in Examples 1 to 14 and Comparative Examples 1 to 4 are shown in Table 2.

TABLE 2

| | | Thermoelectric Performance Evaluation | | | | |
|---|---|---|---|---|---|---|
| | Annealing Treatment B | Electrical Conductivity (S/cm) | Seebeck Coefficient (μV/K) | Thermal Conductivity (W/(m · K)) | ZT (T: 300 K) | Flexi-bility |
| Example 1 | yes | 180 | 150.3 | 0.28 | 0.44 | A |
| Example 2 | yes | 220 | 206 | 0.4 | 0.70 | A |
| Example 3 | yes | 230 | 210 | 0.52 | 0.59 | A |
| Example 4 | yes | 110 | 205 | 0.4 | 0.35 | A |
| Example 5 | yes | 350 | 102 | 0.32 | 0.34 | A |
| Example 6 | yes | 220 | 150 | 0.4 | 0.37 | B |
| Example 7 | yes | 320 | 210 | 0.4 | 1.05 | A |
| Example 8 | yes | 180 | 210 | 0.4 | 0.60 | A |
| Example 9 | yes | 320 | 210 | 0.4 | 1.05 | A |
| Example 10 | yes | 240 | 208 | 0.4 | 0.78 | A |
| Example 11 | yes | 30 | −36 | 0.3 | 0.004 | A |
| Example 12 | yes | 200 | 152.3 | 0.28 | 0.50 | A |
| Example 13 | yes | 190 | 144.3 | 0.28 | 0.42 | A |
| Example 14 | yes | 160 | 100.2 | 0.28 | 0.17 | A |
| Comparative Example 1 | yes | 14.6 | 200 | 0.4 | 0.0438 | A |
| Comparative Example 2 | yes | $2.0 \times 10^{-4}$ | 100 | 0.7 | $8.5 \times 10^{-8}$ | C |
| Comparative Example 3 | no | 0.03 | 201 | 0.4 | 0.0001 | A |
| Comparative Example 4 | yes | $1.5 \times 10^{-3}$ | −35 | 0.3 | $1.8 \times 10^{-7}$ | A |

With respect to the thermoelectric conversion materials of Examples 1 to 10 and 12 to 14, the non-dimensional figure of merit ZT was higher by one order or more than that of the material of Comparative Example 1 in which an ionic liquid was not added. In addition, before and after the cylindrical mandrel test, the thermoelectric conversion materials of these Examples do not have the occurrence of cracks and the like, and the non-dimensional figure of merit ZT thereof lowered little. It was found that the flexibility of these materials was excellent. Further, it was found that the materials of these Examples were much better at the non-dimensional figure merit ZT and the flexibility thereof than the materials of Comparative Examples 2 and 3 not using a heat-resistant resin (but using only a conductive polymer having poor heat resistance).

With respect to the thermoelectric conversion material of Example 11 using the thermoelectric semiconductor fine particles T5 of a sulfide-based thermoelectric semiconductor material, the non-dimensional figure of merit ZT was higher by 3 orders or more than that of the material of Comparative Example 4 comprising T5 and a heat-resistant resin but not containing an ionic liquid, and it was found that the thermoelectric conversion characteristics of the material of this Example were excellent.

INDUSTRIAL APPLICABILITY

The thermoelectric conversion material of the present invention is formed into a thermoelectric conversion element that carries out energy interconversion between heat and electricity, and is set in a module and put into practical use. Concretely, the present invention provides a thermoelectric conversion material capable of being produced in a simplified manner and at a low cost and excellent in thermoelectric performance, which can be used as a low-cost thermoelectric conversion material for large-area applications for, for example, installation on wall surfaces of buildings, etc.

The invention claimed is:

1. A thermoelectric conversion material having, on a support, a thin film of a thermoelectric semiconductor composition containing thermoelectric semiconductor fine particles, a heat-resistant resin, and an ionic liquid,
wherein the blending amount of the thermoelectric semiconductor fine particles is from 30 to 99% by mass in the thermoelectric semiconductor composition, wherein the blending amount of the heat-resistant resin is from 0.5 to 20% by mass in the thermoelectric semiconductor composition, and wherein the blending amount of the ionic liquid is from 0.01 to 50% by mass in the thermoelectric semiconductor composition.

2. The thermoelectric conversion material according to claim 1, wherein the blending amount of the ionic liquid is from 0.5 to 30% by mass in the thermoelectric semiconductor composition.

3. The thermoelectric conversion material according to claim 1, wherein the cation component of the ionic liquid contains at least one selected from a pyridinium cation and its derivatives, and an imidazolium cation and its derivatives.

4. The thermoelectric conversion material according to claim 1, wherein the anion component of the ionic liquid contains a halide anion.

5. The thermoelectric conversion material according to claim 4, wherein the halide anion contains at least one selected from $Cl^-$, $Br^-$ and $I^-$.

6. The thermoelectric conversion material according to claim 1, wherein the heat-resistant resin is at least one selected from polyamide resins, polyamideimide resins, polyimide resins and epoxy resins.

7. The thermoelectric conversion material according to claim 1, wherein the blending amount of the thermoelectric semiconductor fine particles is from 50 to 96% by mass in the thermoelectric semiconductor composition.

8. The thermoelectric conversion material according to claim 1, wherein the mean particle size of the thermoelectric semiconductor fine particles is from 10 nm to 10 µm.

9. The thermoelectric conversion material according to claim 1, wherein the thermoelectric semiconductor fine particles are fine particles of a bismuth-tellurium-based thermoelectric semiconductor material.

10. The thermoelectric conversion material according to claim 1, wherein the support is a plastic film.

11. The thermoelectric conversion material according to claim 10, wherein the plastic film is at least one selected from polyimide films, polyamide films, polyether imide films, polyaramid films and polyamideimide films.

12. A method for producing a thermoelectric conversion material having, on a support, a thin film of a thermoelectric semiconductor composition containing thermoelectric semiconductor fine particles, a heat-resistant resin and an ionic liquid, the method comprising:

applying the thermoelectric semiconductor composition containing thermoelectric semiconductor fine particles, a heat-resistant resin and an ionic liquid onto the support, followed by drying it, to form a thin film thereon and annealing the thin film, wherein the blending amount of the thermoelectric semiconductor fine particles is from 30 to 99% by mass in the thermoelectric semiconductor composition, wherein the blending amount of the heat-resistant resin is from 0.5 to 20% by mass in the thermoelectric semiconductor composition, and wherein the blending amount of the ionic liquid is from 0.01 to 50% by mass in the thermoelectric semiconductor composition.

13. The method for producing a thermoelectric conversion material according to claim 12, wherein the support is a plastic film.

14. The method for producing a thermoelectric conversion material according to claim 12, wherein the annealing treatment is carried out in an inert atmosphere, in a reducing atmosphere, or in a vacuum condition, and the annealing treatment is carried out at a temperature from 100 to 500° C. for a few minutes to several tens hours.

15. The thermoelectric conversion material according to claim 1, wherein the heat-resistant resin is selected from the group consisting of polyamide resins, polyamideimide resins, polyimide resins, polyether imide resins, polybenzoxazole resins, polybenzimidazole resins, and copolymers thereof.

16. The thermoelectric conversion material according to claim 1, wherein the decomposition temperature of the heat-resistant resin is 300° C. or higher.

17. The thermoelectric conversion material according to claim 1, wherein the mass reduction in the heat-resistant resin at 300° C. in thermogravimetry (TG) is 10% or less.

18. The thermoelectric conversion material according to claim 1, wherein the support is a polyimide film, a polyamide film, a polyether imide film, a polyaramid film, or a polyamideimide film.

* * * * *